(12) United States Patent
Nicolaï et al.

(10) Patent No.: US 7,219,420 B2
(45) Date of Patent: May 22, 2007

(54) SCREENING OF A PRINTED-CIRCUIT ELECTRONICS CARD MOUNTED ON A METAL SUBSTRATE

(75) Inventors: Jean Marc Nicolaï, Courbevoie (FR); Marc Duarte, Neuilly Plaisance (FR); Dung Kong-A-Siou, Choisy le Roi (FR)

(73) Assignee: Valeo Vision, Bobigny Cedex (FR)

( * ) Notice: Subject to any disclaimer, the term of this patent is extended or adjusted under 35 U.S.C. 154(b) by 6 days.

(21) Appl. No.: 11/080,276

(22) Filed: Mar. 15, 2005

(65) Prior Publication Data

US 2005/0160679 A1    Jul. 28, 2005

Related U.S. Application Data

(62) Division of application No. 09/423,075, filed on Nov. 1, 1999, now Pat. No. 6,925,708.

(51) Int. Cl.
*H05K 3/30* (2006.01)
(52) U.S. Cl. ............... 29/761; 29/757; 174/50.51; 174/50.54; 174/563; 361/732; 361/759; 315/77

(58) Field of Classification Search ........... 174/50, 174/50.51, 50.54, 17 R, 560, 563; 361/732, 361/737, 759; 257/727, E23.006; 29/832, 29/844, 513, 831, 761, 757; 315/77
See application file for complete search history.

(56) References Cited

U.S. PATENT DOCUMENTS 5,065,279 A * 11/1991 Lazenby et al. ........ 257/727 X
5,278,447 A * 1/1994 Vongfuangfoo et al. .... 257/727

FOREIGN PATENT DOCUMENTS

JP          61-270850        * 12/1986

\* cited by examiner

*Primary Examiner*—A. Dexter Tugbang
(74) *Attorney, Agent, or Firm*—Morgan & Finnegan, LLP

(57) ABSTRACT

A protective assembly for a printed-circuit electronics card having a metal substrate and a metal screening cover electrically connected to the substrate. The substrate includes a recessed gutter in which the edge of the cover is accommodated. The edge is crimped onto the substrate in the gutter.

8 Claims, 2 Drawing Sheets

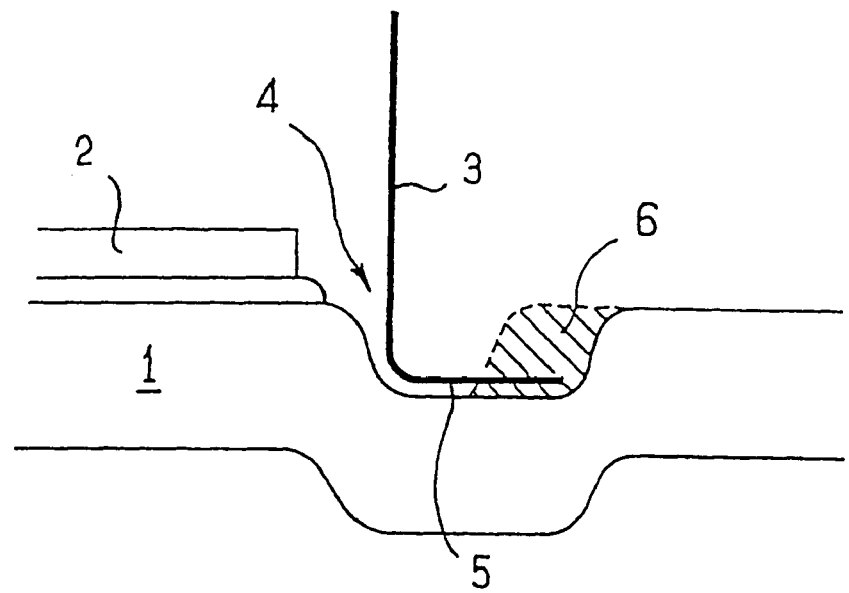
FIG_1
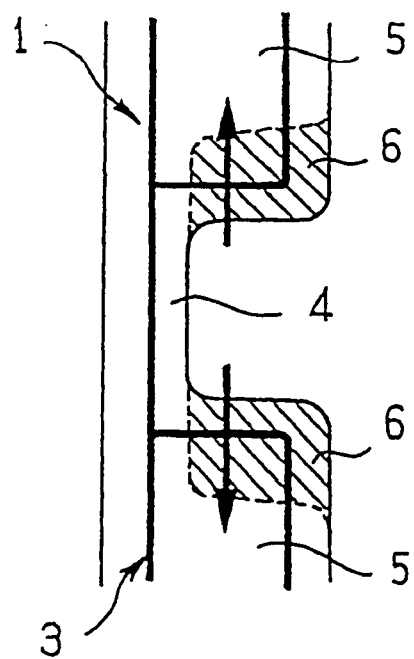
FIG_2a
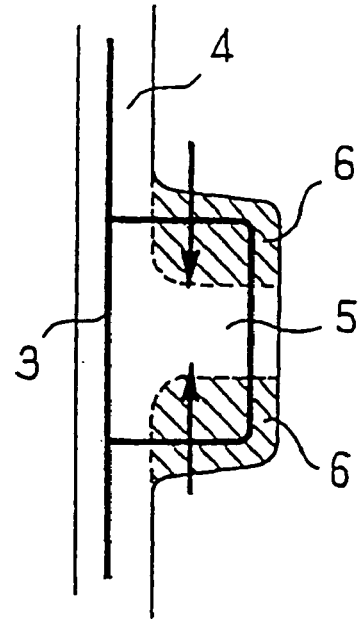
FIG_2b

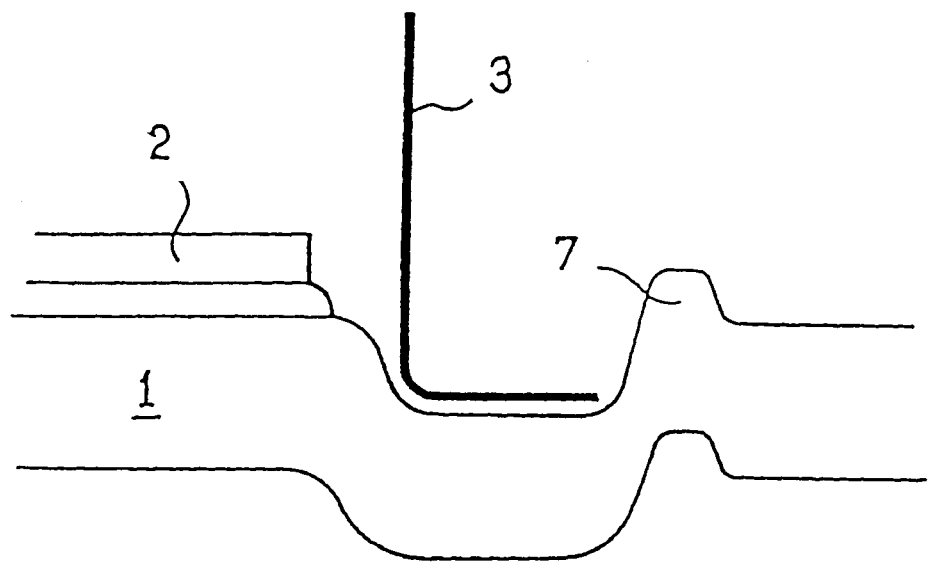
FIG_3
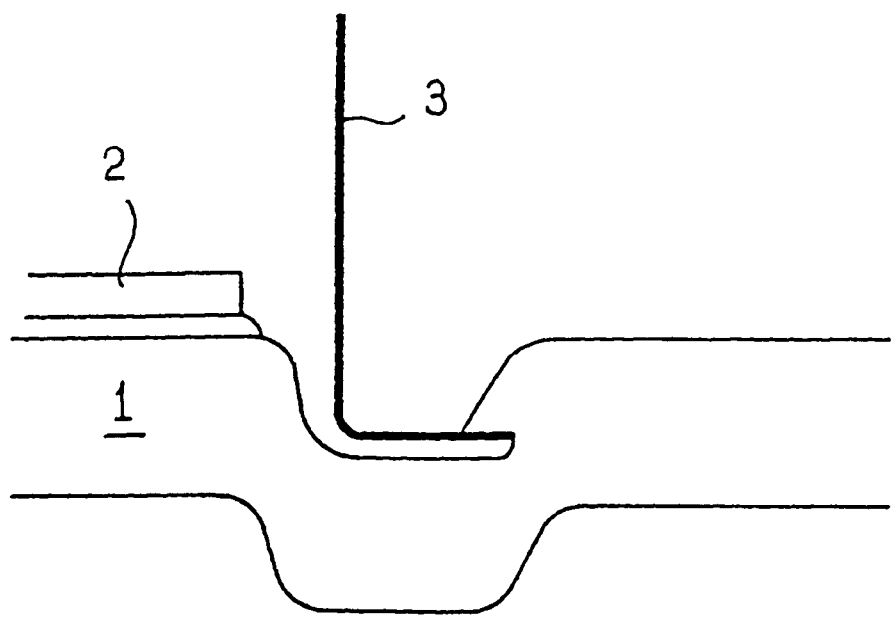
FIG_4

SCREENING OF A PRINTED-CIRCUIT ELECTRONICS CARD MOUNTED ON A METAL SUBSTRATE

CROSS REFERENCE TO RELATED APPLICATION

This application is a division of U.S. application Ser. No. 09/423,075, which was filed on Nov. 1, 1999, and which issued as U.S. Pat. No. 6,925,708.

FIELD OF THE INVENTION

The present invention relates to the electromagnetic screening of a printed-circuit electronics card mounted on a metal substrate. It finds a non-limiting application advantageously to the protection of control circuits of discharge lamps. Such electromagnetic screening is generally achieved by means of a metal cover closed over the substrate.

BACKGROUND OF THE INVENTION

At present, two main types of techniques are used to fit such a cover. According to a first type of solution, the electrical connection of the metal cover to the earth which the metal substrate constitutes is formed independently of the mechanical fixing of the said cover with respect to the said substrate and to the electronics card. For example, the electrical connection to earth may then be formed by means such as riveting, screwing, a soldered joint or even a soldered wire link. In a second type of solution, the metal cover is fixed mechanically to the substrate by means of an adhesive which is made from an electrically conducting material and which carries out the electrical connection function.

However, these two types of solutions both exhibit drawbacks. In particular, the solutions in which the mechanical fixing and electrical connection are achieved by different means require additional operations during manufacture and are expensive. Moreover, with these solutions, the leaktightness between the metal cover and the substrate is not generally assured. Equally, the solutions in which a conducting adhesive are used also carry a high cost particularly because of the operation of applying a bead of adhesive. Moreover, with these solutions, the adhesive joints pose problems of behaviour over time, as well as of response to temperature and to vibration.

SUMMARY OF THE INVENTION

One object of the invention is to propose a screening solution which does not exhibit these drawbacks. To this end, the invention proposes an assembly including a printed-circuit electronics card mounted on a metal substrate, as well as a metal screening cover electrically connected to the substrate, the substrate exhibiting a recessed gutter in which the edge of the cover is accommodated, the said edge being crimped onto the said substrate in the gutter.

The invention also proposes a method for producing such an assembly, characterised by the following stages:
the substrate is stamped so as to form a gutter in it,
the electronics card is assembled onto the said substrate,
the cover is positioned on the assembly thus obtained, arranging the edge of the said cover in the said gutter,
the said edge is crimped onto the said substrate.

Other characteristics of the invention will emerge further from the description which follows. This description is purely illustrative and not limiting.

BRIEF DESCRIPTION OF THE DRAWINGS

It should be read in the light of the attached drawings on which:

FIG. 1 is a diagrammatic representation in a sectional view illustrating the fixing of a screening cover in accordance with one possible embodiment for the invention;

FIGS. 2a and 2b are diagrammatic representation, in a top view, illustrating two possible crimping modes;

FIGS. 3 and 4 are diagrammatic representations in a sectional view similar to that of FIG. 1 illustrating a possible implementation for crimping the metal cover onto the substrate.

DETAILED DESCRIPTION OF THE PREFERRED EMBODIMENTS

In FIG. 1, a metal substrate 1, a printed-circuit electronics card 2 and a metal screening cover 3 have been represented. The substrate 1 has a recessed gutter 4 produced by stamping the material. This gutter 4 extends over the said substrate along a contour which corresponds to that of the edge of the metal cover 3. This gutter 4 is intended to accommodate the edge of the metal cover 3.

The metal cover 3 is fixed into the gutter 4 by crimping. To this end, the said edge is extended by one or more tabs 5, which form an L-shaped return extending outwards from the cover 3. Such a tab 5 is accommodated in a region of the gutter 4 which is shaped with a width which coincides with that of the said tab 5. Hence, the said tab 5 is inserted exactly into the recessed shape of the gutter 4. The length of such a tab 5 is 3 mm, for example, while that of a recessed pattern which accommodates it is 4 mm.

The cover 3 is mounted onto the substrate 1 in the following way. The substrate 1 is first of all stamped so as to form the gutter 4. At the same time an excess of material is obtained which in this instance constitutes the edge of the gutter 4. Next, the electronics card 2 is assembled onto the substrate 1. The cover 3 is then put in place in the gutter 4. When the cover 3 is correctly positioned, localised crimping is carried out, by lateral displacement of the material of the substrate on top of corners of the tabs 5 of the cover 3. The material displaced during the crimping is that which forms the edges of the gutter originating from the stamping. More particularly, as FIGS. 2a and 2b illustrate, the material pushed back by the stamping during the formation of the gutter exerts on the tabs 5, after crimping, parallel forces canceling each other out. The material displaced during the crimping is referenced by 6.

Two implementations are possible: the crimping can be carried out by crushing a fairly short part of the substrate coming to cover over the fairly long tabs 5 (FIG. 2a); in a variant, it can be carried out by simultaneous crushing of two parts of the substrate coming to cover over fairly short tabs 5 (FIG. 2b).

As FIGS. 3 and 4 illustrate, the mould in which the substrate 1 is stamped may be shaped in such a way that the said stamped substrate 1 exhibits, at the edge of the gutter 4, a protuberance 7 which constitutes the excess material to be displaced during the crimping; the height of this protuberance is adjusted so as to remain below the upper level of the electronics card 2, so as not to prevent the screen-printing of the soldering paste for mounting the components prior to the cover 3 being put in place.

Moreover, the depth of the gutter 4 is adjusted so that the bottom of the said gutter 4 and the return 5 are below the electronics card 2. This makes it possible to prevent any risk of leakage of electromagnetic waves.

Advantageously, during the initial crimping, only some of the tabs of the cover 5 are used, which makes it possible to preserve the possibility of using the other tabs, in the event of a subsequent dismantling, for a second crimping. Consequently, the method which has just been described is compatible with a removal of the cover.

The technique which has just been described exhibits numerous advantages: it is much simpler than the prior techniques, since the mechanical mounting of the cover, the positioning thereof and the forming of electrical contact between the cover and the metal substrate are carried out in a single operation; the completed assembly allows for an absence of leakages of electromagnetic waves; the metal substrate remains perfectly leaktight, since it is free from perforations; the mechanical rigidity of the assembly as a whole is enhanced; in particular, the gutter formed over the whole of the periphery of the metal substrate constitutes a rib which contributes to this rigidity; this rigidity is also enhanced by the stamping of the cover when it is crimped onto the metal substrate; it will be noted that the increase in the rigidity obtained makes it possible to reduce the thickness of the metal substrate; equally, with the technique proposed, it is possible to remove then to refit the cover.

The screening which has just been described may be used in all fields of electronics where insulated metal substrates are used, and particularly advantageously in motor vehicle electronics, energy conversion, power supplies, power multiplexers, electric motor power supplies, etc. In particular it can be employed in the screening of the control circuit (ballast, according to the terminology of the person skilled in the art) of a discharge lamp where the problem of leakages of electromagnetic waves has not been completely resolved up to the present.

The invention claimed is:

1. An assembly comprising:
   (a) a printed-circuit electronics card;
   (b) a metal substrate comprising
      (i) a base surface upon which the printed-circuit electronics card is coupled and
      (ii) a recessed gutter having a length and a bottom surface disposed at a level below the base surface; and
   (c) a metal screening cover electrically coupled to the substrate and having a side wall with a bottom edge, the edge is received within and extends along the length of the bottom surface of the recessed gutter at a level below the base surface of the metal substrate, wherein the edge is crimped onto the substrate in the recessed gutter.

2. The assembly according to claim 1, wherein the edge of the cover comprises at least one tab having a bottom surface, which is crimped into the gutter.

3. The assembly according to claim 2, wherein the bottom surfaces of the gutter and the tab are disposed at a level below the base surface of the metal substrate.

4. The assembly according to claim 2, wherein the at least one tab extends perpendicularly outward from the metal screening cover side wall.

5. The assembly according to claim 2, wherein the metal screening cover comprises a plurality of tabs and at least one of the tabs is not crimped onto the substrate.

6. The assembly according to claim 1, wherein the metal substrate does not include any perforations.

7. The assembly according to claim 1, wherein the metal screening cover is positioned to be capable of electromagnetically screening the printed-circuit electronics card.

8. A motor vehicle having a control circuit for a discharge lamp, comprising the assembly according to claim 1 wherein the assembly prevents electromagnetic interference between the discharge lamp control circuit and the printed-circuit electronics card.

* * * * *